United States Patent
Lin et al.

(10) Patent No.: US 8,765,258 B2
(45) Date of Patent: Jul. 1, 2014

(54) COVER FILM

(75) Inventors: Chih-Ming Lin, Hsinchu (TW);
Shou-Jui Hsiang, Hsinchu (TW);
Chien-Hui Lee, Hsinchu (TW)

(73) Assignee: Asia Electronic Material Co., Ltd, Chubei, Hsinchu (TW)

( * ) Notice: Subject to any disclaimer, the term of this patent is extended or adjusted under 35 U.S.C. 154(b) by 108 days.

(21) Appl. No.: 12/841,535

(22) Filed: Jul. 22, 2010

(65) Prior Publication Data
US 2011/0086192 A1    Apr. 14, 2011

(30) Foreign Application Priority Data

Oct. 12, 2009  (TW) ............................... 98218764 U

(51) Int. Cl.
*B32B 7/12* (2006.01)
*B32B 15/04* (2006.01)

(52) U.S. Cl.
USPC ....................... 428/343; 428/354; 428/355 R

(58) Field of Classification Search
USPC ..................................... 428/343, 354, 355 R
See application file for complete search history.

(56) References Cited

U.S. PATENT DOCUMENTS 3,896,076 A * 7/1975 Watanabe et al. ............. 523/440
2004/0099374 A1 * 5/2004 Kanakarajan ............. 156/345.1

* cited by examiner

*Primary Examiner* — Victor Chang
(74) *Attorney, Agent, or Firm* — Amin, Turocy & Watson, LLP

(57) ABSTRACT

The present invention provides a cover film for a printed circuit board. The cover film includes an adhesive layer; a core layer made of a polymer; and a composite material layer formed on the core layer, comprising epoxy resin, a black material selected from the group consisting of a black pigment, carbon powder, nano carbon tube and a combination thereof, and an additive selected from the group consisting of titanium dioxide, boron nitride, barium sulfate and a combination thereof, wherein the core layer is disposed between the adhesive layer and the composite material layer, and the adhesive layer and the composite material layer have the same thickness or have a thickness difference being no more than 15 micro meters. The cover film of the preset invention is capable of shielding circuit patterns and has great folding endurance, and is thus applicable to flexible printed circuit boards.

12 Claims, 3 Drawing Sheets

COVER FILM

BACKGROUND OF THE INVENTION

1. Field of the Invention

The present invention relates to a cover film for a printed circuit board, and more particularly, to a cover film having a composite material layer with low gloss applicable to a printed circuit board, which needs circuit shield.

2. Description of Related Art

Printed circuit boards are essential components in electrical products. Printed circuit boards are in high demand as the increased demand of commercial electrical products. Flexible printed circuit boards are flexible for 3D wiring, so as to be widely used in computers, communication products, commercial electrical products and the like which need to be thin and small.

Generally, flexible printed circuit boards are formed by flexible copper clad laminates (FCCL) and cover films (CL). A plastic film is used as or a thin insulating ink layer is printed as a cover film for a printed circuit board. However, ink cracks in the conventional cover films. Currently, most cover films in the market are bright polyimide thin film. In order to form a polyimide film applicable to layout of shield circuits, a black adhesive layer 12 is formed on a polyimide thin film 11 as shown in FIG. 1A. However, the surface of the polyimide thin film is still too bright, and thus fails to meet the requirement in specific optical application.

There is another polyimide film as shown in FIG. 1B. A black polyimide thin film 11a has carbon powder, and an adhesive layer 12a is formed on the black polyimide thin film 11a. This polyimide film has better anti-glare effect, but has high cost. The polyimide films with additives have poor anti-tensile strength and size stability.

Therefore, there is a need to develop a cover film having low cost, good anti-glare effect and great folding endurance.

SUMMARY OF THE INVENTION

The present invention provides a cover film for a printed circuit board. The cover film includes an adhesive layer for attaching the cover film to the printed circuit board; a core layer made of a polymer; and a composite material layer formed on the core layer, comprising epoxy resin, a black material selected from the group consisting of a black pigment, carbon powder, nano carbon tube and a combination thereof, and an additive selected from the group consisting of titanium dioxide, boron nitride, barium sulfate and a combination thereof, wherein the core layer is disposed between the adhesive layer and the composite material layer.

In an aspect, the thickness of the core layer is between 6 to 25 micro meters; the thickness of the composite material layer is between 3 to 20 micro meters; and the thickness of the adhesive layer is between 6 to 35 micro meters.

In another aspect, the adhesive layer and the composite material layer have the same thickness or have a thickness difference being no more than 15 micro meters.

The fabrication of the cover film in the present invention is simple. Further, the composite material layer has low reflection rate and black color. Hence, the outer surface of the cover film has the characteristics of a mist surface, so as to be suitable for printed circuit boards, which need shield of circuit patterns. Moreover, the thickness of the cover film is controlled to keep folding endurance and flatness.

DETAILED DESCRIPTION OF THE PREFERRED EMBODIMENTS

The detailed description of the present invention is illustrated by the following specific examples. Persons skilled in the art can conceive the other advantages and effects of the present invention based on the disclosure contained in the specification of the present invention.

In the present invention, lightness (alternatively referred as L value) refers to the definition defined by International Commission on Illumination. Generally, white color has highest lightness, and black color has lowest lightness. The composite material layer is adjusted near black color, and thus has low lightness. In the present invention, lightness is measured by ColorQuest Xehunterlab.

Gloss refers to light reflection degree of the surface of the composite material layer. There is no unit for gloss. The higher gloss value means the stronger light reflection. The smaller gloss value means the weaker light reflection. In the present invention, gloss is measured by a gloss meter (Novo Gloss™).

Figure 2:
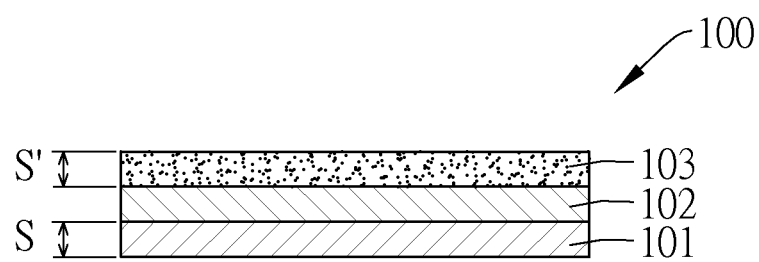
FIG. 2 is a schematic view showing the cross-section structure of a cover film according to the present invention.

FIG. 2 shows a cover film 100 of the present invention. The cover film 100 includes an adhesive layer 101; a core layer 102 made of a polymer; and a composite material layer 103 formed on the core layer 102. The core layer 102 is disposed between the adhesive layer 101 and the composite material layer 103. The composite material layer 103 includes epoxy resin, one or more selected from a black pigment, carbon powder and nano carbon tubes, and an additive selected from the group consisting of titanium dioxide, boron nitride, barium sulfate and a combination thereof. The adhesive layer 101 and the composite material layer 103 have the same thickness or have a thickness difference being no more than 15 micro meters which are used for attaching on wiring layers of printed circuit boards.

In order to form a cover film for shielding circuit patterns, a composite material layer having one or more black materials selected from a black pigment, carbon pattern and nano carbon tubes is formed, and the solid content of black material in the epoxy resin is 3 to 15 wt %, and preferably 4 to 8 wt %. In addition, the pigment can be dye or color powder, and can be organic or inorganic.

The composite material layer further includes an additive selected from the group consisting of titanium dioxide, boron nitride, barium sulfate and a combination thereof. Generally, a substrate of the composite material layer is epoxy resin for maintaining folding endurance and anti-scratch property of the composite material layer or the cover film, and the additive is 3 to 20 wt %, and preferably 3 to 6 wt % of the epoxy resin.

In the cover film of the present invention, the material of the core layer is, but not limited to, thermal curing resin or photocuring resin, and preferably thermal curing resin. Further, the material of the core layer is selected from the group consisting of polyimide, polyethylene terephthalate, polyaniline, polyethylene naphthalate, triacetine and polycarbonate, and preferably selected from polyimide and polyethylene terephthalate.

The thickness of the core layer in the present invention is between 6 to 25 micro meters; the thickness of the core layer in the present invention is between 3 to 20 micro meters; and the thickness of the core layer in the present invention is between 6 to 35 micro meters.

In one embodiment, the adhesive layer and the composite material layer have the same thickness (S, S') or have a thickness difference being no more than 15 micro meters, such that the cover film has better folding endurance.

Figure 1A:
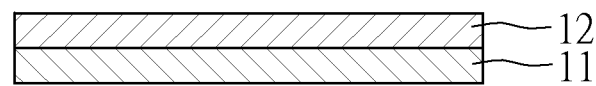
FIGS. 1A and 1B are schematic views showing the cross-section structures of conventional cover films.
Figure 1B:
Figure 3:
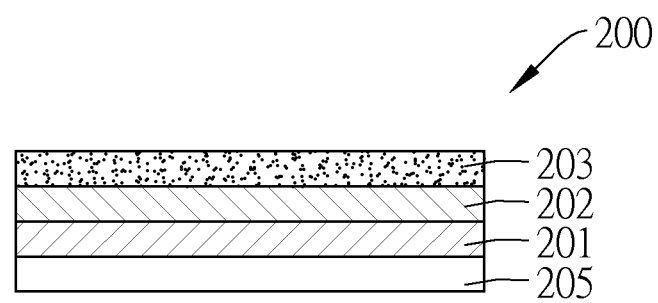
FIG. 3 is a schematic view showing the cross-section structure of another cover film according to the present invention.

FIG. 3 shows a cover film 200 according to another embodiment of the present invention. The cover film 200 includes an adhesive layer 201, a core layer 202, a composite material layer 203, a release layer 205 formed on the adhesive layer 201 and attached on an outer surface of the adhesive layer 201, wherein the adhesive layer 201, the core layer 202 and the composite material layer 203 have the same structure as those in FIG. 1. The adhesive layer 201 is used for attaching to a surface of wiring layer of a printed circuit board. The attachment of the release layer keeps the adhesiveness of the adhesive layer 201.

Figure 4:
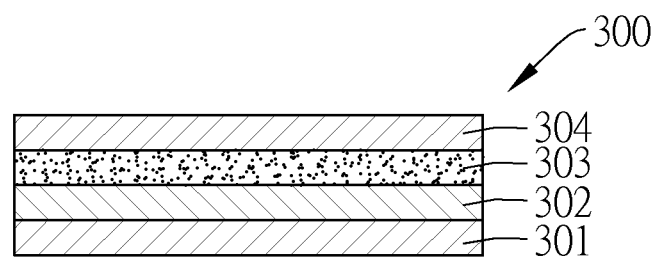
FIG. 4 is a schematic view showing the cross-section structure of a protection layer according to the present invention.

FIG. 4 shows a cover film 30 according to another embodiment of the present invention. The cover film 300 includes an adhesive layer 301, a core layer 302, a composite material layer 303, and a protection layer 304 attached on the composite material layer 303. The composite material layer 303 is disposed between the protection layer 304 and the core layer 302, and has a thickness being between 3 to 15 micro meters. The material of the protection layer 304 is preferably to show the gloss of the composite material layer. For example, the protection is made of a transparent polymer. Alternatively, the protection layer can be stripped without damage to the composite material layer.

Formation of a Cover Film of the Present Invention

A polyimide film having a thickness being 12.5 micro meters was used as a substrate of a core layer. The polyimide film was coated with liquid having epoxy resin, titanium dioxide and nano carbon tubes, and after the liquid was dried and cured, a composite material layer having a thickness being about 13 micro meters was formed. The other side of the core layer which has no composite material layer formed thereon was coated or printed with an adhesive agent, and a cover film was thus formed.

Certainly, a release layer can be attached on the adhesive layer for keeping adhesiveness of the epoxy resin layer, so as to facilitate the subsequent processing such as attaching to printed circuit boards or pressing procedure.

Test of Lightness and Gloss of Cover Films

The cover films (Example 1-3) formed in the present invention includes the composite material layer having nano carbon tubes being 5 wt % of the epoxy resin content and the additive as listed in Table 1. In addition, the cover films (Comparative Example 1 and Comparative 2) shown in FIG. 1 and FIG. 2 were tested for comparison. Comparative Example 3 is the common yellow cover film. Lightness and gloss of the cover films were tested by ColorQuest Xehunterlab and the gloss meter. The results are shown in Table 1.

TABLE 1

|  | Example 1 | Example 2 | Example 3 | Comparative Example 1 | Comparative Example 2 | Comparative Example 3 |
| --- | --- | --- | --- | --- | --- | --- |
| Content of additive | 5 wt % | 5 wt % | 5 wt % | — | — | — |
| additive | titanium dioxide | boron nitride | barium sulfate | — | — | — |
| lightness | 31.84 | 38 | 35 | 28.62 | 32.41 | 76.62 |
| gloss | 20 | 25 | 32 | 115.8 | 17.3 | 119.8 |

As shown in Table 1, the cover film of the present invention has significantly lower lightness than that of the common yellow cover film, and has gloss similar to that of Comparative Example 2 but significantly lower than that of Comparative Example 1. The cover films of the present invention have anti-glare effect. The anti-scratch property of the cover films (Examples 1-3) of the present invention were tested with 3M-610 tape. The test results meet the standard of ISO class 1/ASTM class 4B and have outstanding anti-scratch property.

Test of Electrical Property of Cover Films

The electrical property of the cover films (Example 1 and Comparative Examples 1-3) was tested. The electrical property includes dielectric constant, consumption factor and dielectric breakdown voltage. The results are shown in Table 2.

TABLE 2

|  | Example 1 | Comparative Example 1 | Comparative Example 2 | Comparative Example 3 |
| --- | --- | --- | --- | --- |
| dielectric constant (MHZ) | 4.39 | 4.9 | 4.6 | 3.81 |
| consumption factor (MHZ) | 0.0666 | 0.0432 | 0.0359 | 0.0411 |
| dielectric breakdown voltage (KV) | 5.2 | 5.4 | 2.4 | 5.8 |

As shown in Table 2, the dielectric breakdown voltage of the cover films of the present invention is comparable to those of Comparative Examples 1 and 3, and significantly higher than that of Comparative Example 2. The cover film of Comparative Example is too high to have anti-glare property.

Test of Mechanical Property of Cover Films

The mechanical property of the cover films of Example 1 and Comparative Example 2 were tested. The mechanical property includes folding endurance property and anti-tearing strength. In the folding endurance test device, R is set as 0.38 mm, maximum load of weight is set 0.5 kg, and the swing angle is set 135±5 degrees. The test results are shown in Table 3.

TABLE 3

|  | Example 1 | Comparative Example 2 |
| --- | --- | --- |
| longitudinal direction (times) | 750 | 380 |
| horizontal direction (times) | 800 | 400 |
| anti-tearing strength (g) | 1134 | 627 |

As shown in Table 3, the cover film of the present invention has significantly higher folding endurance and anti-tearing strength than that of Comparative Example 2. In addition, anti-tearing strength of the cover films of the present invention has significantly higher anti-tearing strength than that of Comparative Examples 1 and 2 (937, 1080).

The invention has been described using exemplary preferred embodiments. However, it is to be understood that the scope of the invention is not limited to the disclosed arrangements. The scope of the claims, therefore, should be accorded the broadest interpretation, so as to encompass all such modifications and similar arrangements.

What is claimed is:

1. A cover film, comprising:
   an adhesive layer;
   a composite material layer, comprising epoxy resin, a black material comprising at least one of a black pigment, carbon powder, nano carbon tube or a combination thereof, and an additive comprising at least one of titanium dioxide, boron nitride, barium sulfate or a combination thereof; and
   a core layer, comprising a polymer and disposed between the adhesive layer and the composite material layer,
   wherein the adhesive layer and the composite material layer have the same thickness or have a thickness difference being no more than 15 micro meters, the adhesive layer facilitates attachment of the composite layer and the core layer to a printed circuit board, and the cover film meets the anti-scratch standard of ISO class 1/ASTM class 4B.

2. The cover film of claim 1, further comprising a release layer attached on an outer surface of the adhesive layer.

3. The cover film of claim 1, wherein a thickness of the core layer is ranged from 6 to 25 micro meters.

4. The cover film of claim 1, wherein a thickness of the composite material layer is ranged from 3 to 20 micro meters.

5. The cover film of claim 1, wherein a thickness of the adhesive layer is ranged from 6 to 35 micro meters.

6. The cover film of claim 1, wherein the core layer is made of a material selected from the group consisting of polyimide, polyethylene terephthalate, polyaniline, polyethylene naphthalate, triacetine, and polycarbonate.

7. The cover film of claim 1, wherein solid content of the black material is 3 to 15 wt % of the epoxy resin, and solid content of the additive is 3 to 20 wt % of the epoxy resin.

8. The cover film of claim 1, further comprising a protection layer attached on the composite material layer, wherein the composite material layer is disposed between the core layer and the protection layer, and a thickness of the protection layer is between 3 to 15 micro meters.

9. A cover film, comprising:
   an adhesive layer having a thickness being between 6 to 35 micro meters;
   a composite material layer, comprising epoxy resin, a black material comprising at least one of a black pigment, carbon powder, nano carbon tube or a combination thereof, and an additive comprising at least one of titanium dioxide, boron nitride, barium sulfate or a combination thereof, wherein a thickness of the composite material layer is between 3 to 20 micro meters; and
   a core layer, comprising a polymer, disposed between the adhesive layer and the composite material layer, and having a thickness between 6 to 25 micro meters, wherein the adhesive layer facilitates attachment of the composite layer and the core layer to a printed circuit board, and the cover film meets the standard of ISO class 1/ASTM class 4B.

10. The cover film of claim 9, further comprising a release layer attached on an outer surface of the adhesive layer.

11. The cover film of claim 10, wherein solid content of the black material is 3 to 15 wt % of the epoxy resin, and solid content of the additive is 3 to 20 wt % of the epoxy resin.

12. The cover film of claim 9, further comprising a protection layer attached on the composite material layer, wherein the composite material layer is disposed between the core layer and the protection layer, and a thickness of the protection layer is between 3 to 15 micro meters.

* * * * *